(12) United States Patent
Lee et al.

(10) Patent No.: US 7,142,455 B1
(45) Date of Patent: Nov. 28, 2006

(54) POSITIVE GATE STRESS DURING ERASE TO IMPROVE RETENTION IN MULTI-LEVEL, NON-VOLATILE FLASH MEMORY

(75) Inventors: Sung-Chul Lee, Cupertino, CA (US); Sheung-Hee Park, Pleasanton, CA (US); Richard M. Fastow, Cupertino, CA (US)

(73) Assignee: Spansion, LLC, Sunnyvale, CA (US)

( * ) Notice: Subject to any disclaimer, the term of this patent is extended or adjusted under 35 U.S.C. 154(b) by 56 days.

(21) Appl. No.: 10/839,562

(22) Filed: May 4, 2004

(51) Int. Cl.
*G11C 16/04* (2006.01)

(52) U.S. Cl. .......................... 365/185.19; 365/185.03; 365/185.02

(58) Field of Classification Search ........... 365/185.19, 365/185.03, 185.02
See application file for complete search history.

(56) References Cited

U.S. PATENT DOCUMENTS

| | | | | |
|---|---|---|---|---|
| 6,049,484 A | * | 4/2000 | Lee et al. | 365/185.29 |
| 6,614,693 B1 | * | 9/2003 | Lee et al. | 365/185.19 |
| 6,700,820 B1 | * | 3/2004 | Elmhurst et al. | 365/185.03 |
| 2005/0179079 A1 | * | 8/2005 | Wu | 257/316 |

* cited by examiner

*Primary Examiner*—Huan Hoang (57) ABSTRACT

A new method for improving the accuracy of read-write operations in a multi-level flash memory cell is disclosed. The method reduces the read margin disturbance caused by the accumulation of holes at a tunneling oxide or tunneling oxide-silicon interface underneath a floating gate of the cell by applying a positive stress to the word line after a program-erase cycle.

11 Claims, 13 Drawing Sheets

POSITIVE GATE STRESS DURING ERASE TO IMPROVE RETENTION IN MULTI-LEVEL, NON-VOLATILE FLASH MEMORY

FIELD OF INVENTION

The present invention generally relates to non-volatile semiconductor devices and more specifically to multi-level flash memory cell.

BACKGROUND ART

Semiconductor memory devices are essential to any modern digital electronic system. Semiconductor memory may be categorized into random access memory (RAM) and read only memory (ROM). In contrast to RAM, ROM memory is non-volatile and as the name suggests, ROMs allow retrieval of previously stored information. Depending on the method used to write information into a ROM, ROM memory is further categorized as masked ROM and programmable ROM. Masked ROM refers to arrays of memory where data is written onto the ROM at the chip fabrication time. In contrast, programmable ROMs allow data to be written onto the chip after fabrication. Data in a programmable ROM may be erased using ultraviolet light, referred to as an erasable read only memory (EPROM). Alternatively, data may be erased from the EPROM using high electrical voltage. EPROMs requiring high voltage to erase stored data are referred to as electrically erasable programmable read only memory (EEPROM).

Figure 1:
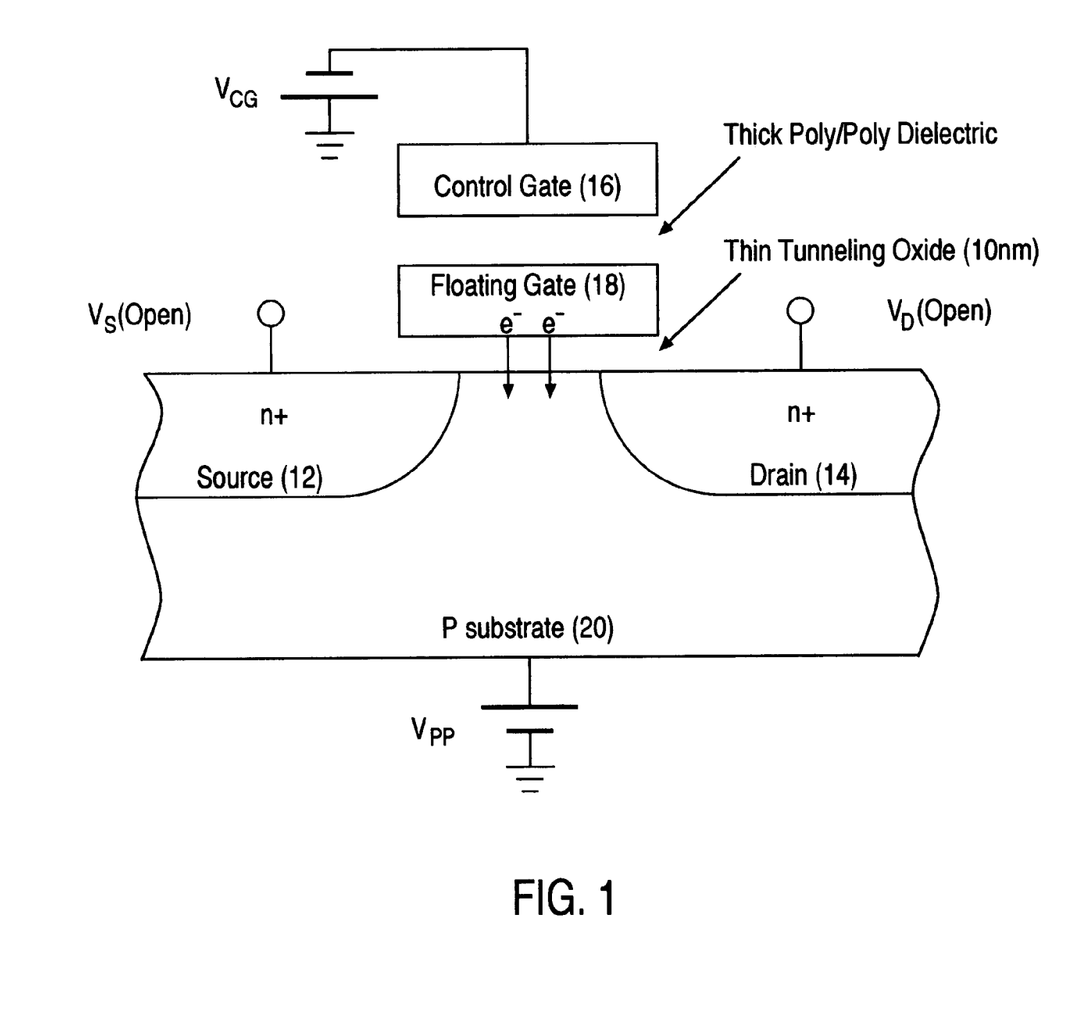
FIG. 1 is a cross section view of an exemplary prior art flash memory device in the erase mode.

Flash memory is similar to an EEPROM. FIG. 1 is a cross section view of an exemplary prior art flash memory device in the erase mode. As shown in FIG. 1, a common flash memory device 10 is based on an n-channel MOSFET, including a source 12, a drain 14, a control gate 16, and a floating gate 18. The flash memory device 10 is shown in the erase mode, with P substrate 20 connected to $V_{PP}$ usually at larger than 9 volts. The bit line coupled to the drain 14 and source line 12 are kept open (or floating). The control gate 16 is connected to negative voltage $V_{CG}$.

The threshold voltage of a flash memory device is programmed by either storing at, or ejecting from, electrons at the floating gate of a MOS transistor through channel hot-electron injection or Fowler-Nordheim tunneling mechanisms.

The application of a high voltage (e.g. 12 volts) to the control gate 16 while the source 12 is grounded and the drain (bit line) 14 is sufficiently high voltage such as 5 volts, causes the accumulation of electrons at the floating gate 18, resulting in a higher threshold voltage. The higher threshold voltage results in the MOSFET device that remains turned off, during the application of a low voltage read signal (e.g. 5 volts in the control gate 16). This in turns results in a reading of high voltage (usually 5 volts), at the bit line, corresponding to a logic level 0 or programmed state.

Alternatively, in the erase mode of operation, the application of high voltage (e.g. 9 volts) to the P-substrate 20 with negative voltage to the control gate 16, with the source 12 and the drain 14 kept open, creates high electric field between the control gate 16 and the P-substrate 20, causing the electrons stored at the floating gate 18 to eject through a Fowler-Nordheim tunneling effect to the P-substrate 20. This reduction of the number of stored electrons at the floating gate 18 reduces the threshold voltage of the MOSFET device 10. The lowered threshold voltage allows the MOSFET device 10 to be turned on, with the application at the control gate 16 of a 5 volts read signal. Thus, during a read operation, the bit line (drain 14) is brought down to ground, resulting in a reading of a logical 1 or erased state.

In a traditional bi-level flash memory circuit, the gap between the zero logic level corresponding to the lower threshold voltage and the one logic level, corresponding to the higher threshold voltage is typically in the order of two to three volts. Therefore, relatively minor disturbances in the order of couple of hundred milli-volts (mV) will not affect the operation of a bi-level flash memory cell. One cause of such shifts in the threshold voltage levels may be the de-trapping of holes (positive charges) at the tunneling oxide or tunneling oxide-silicon interface underneath of the floating gate, resulting in a shift of the threshold voltages toward higher voltage levels. Similarly, the de-trapping of electrons (negative charges) at the tunneling oxide or tunneling oxide-silicon interface may result in a lower threshold voltage than desired. In a bi-level flash memory cell, even the lower threshold voltage shifts several hundreds of milli-volts, the voltage gap between the high and low threshold voltage levels is wide enough to allow for a satisfactory operation of the device.

Reducing memory density is a constant goal of designers. In the past, reducing the cell size has been the primary technique of reducing memory density. Another method of improving the effective density of a memory arrays is operating the flash memory devices in multi-level mode of operation, allowing for a single memory cell to store a couple of bits of data.

Figure 2:
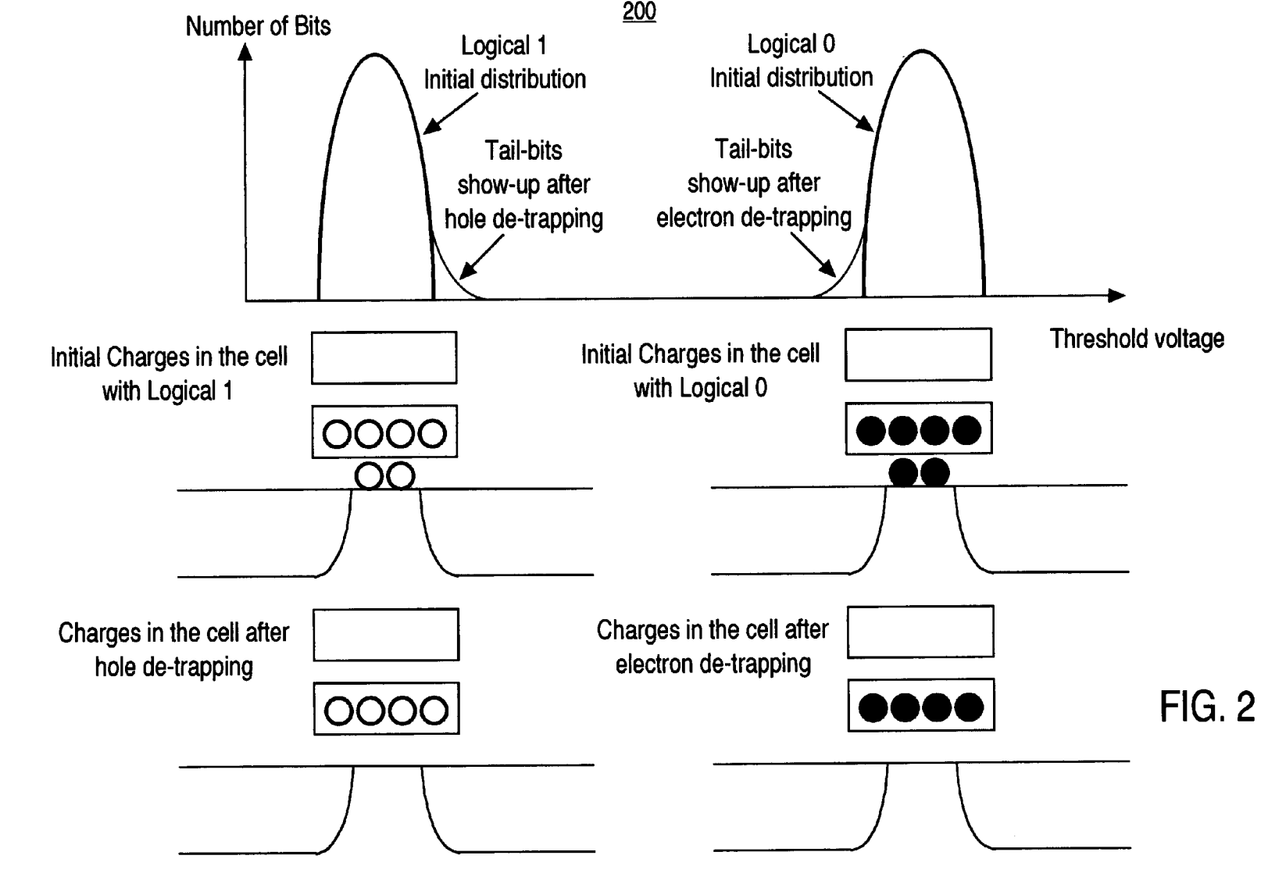
FIG. 2 illustrates a tail-bit due to the de-trapping of holes or electrons at the tunneling oxide or tunneling oxide-silicon interface.

FIG. 2 illustrates a multilevel cell threshold voltage distribution, allowing a single cell to store 2 bits per cell. The inherent feature of flash memory, namely the ability to change or program the threshold voltage allows a flash memory cell to operate at multiple levels corresponding to storage of multiple bits in a single memory cell. The number of states per cell is limited by several factors including the available charge range, the accuracy of the programming, erase and read operations, and the disturbances of a state over time. One such disturbance of a state may be caused by de-trapping of the holes, which are trapped at the tunneling oxide or tunneling oxide-silicon interface, resulting in a shift in the threshold voltage corresponding to a level of a multi-level cell. Experimental results have shown that the de-trapping of the trapped holes at the tunneling oxide or tunneling oxide-silicon interface begins to affect the operation of the multi-level cell within less than ten minutes after the flash cell has received some standard write-erase cycling (such as 10,000 cycles), simulating the device in real operating conditions.

Figure 3:
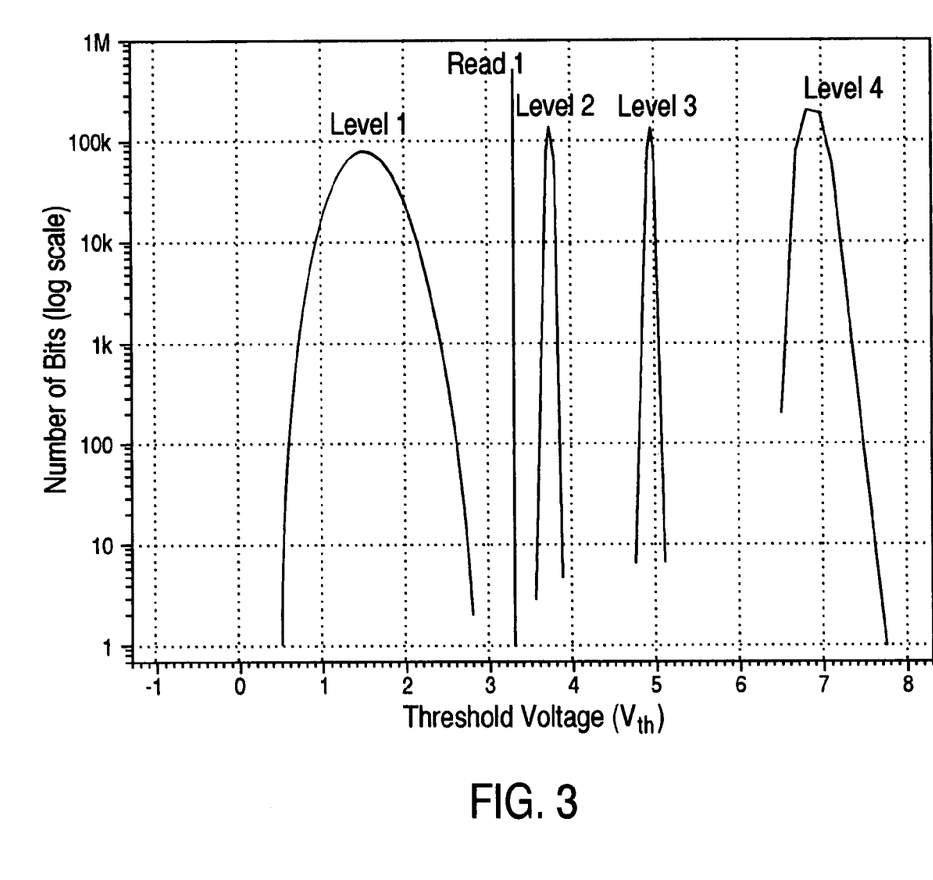
FIG. 3 shows an experimentally measured threshold voltage distribution graph for a flash memory device.

FIG. 3 illustrates an experimentally determined graph of the threshold level distributions for a flash memory cell. Because of the de-trapping of the trapped holes at the tunneling oxide or tunneling oxide-silicon interface, the threshold voltages corresponding to each of the four logic levels shown in FIG. 3 tends to shift to the right, i.e. toward the next higher logic level. The drift additionally reduces the gap between the various levels, thus reducing the program and read accuracy of the cell and resulting in a deterioration of the read disturb for each of the different multi-level cell (MLC) levels. Even a shift of a couple of hundred milli-volts may be significant enough to result in problematic operation of the multi-level memory cell.

It is therefore desirable to provide a method of programming and erasing of data into a multi-level cell that would result in a lesser disturbance of the read/write accuracy of a multi-level flash memory cell.

It is further desirable that such a method be easily applicable to multi-level cell operation.

SUMMARY OF THE INVENTION

A new method for improving the accuracy of read-write operations in a multi-level flash memory cell is disclosed. The method reduces the read margin disturbance caused during normal operation of the cell by applying a positive stress to the word line after a program-erase cycle.

In one embodiment, a method for de-trapping trapped charges in a non-volatile multi-level flash memory device is disclosed. According to the method, a de-trapping pulse is applied to a control gate of a non-volatile multi-level memory device to de-trap positive charges (holes) trapped at the tunneling oxide or tunneling oxide-silicon interface. In one embodiment, the application of the pulse occurs after the erase pulse but before the programming pulse.

Another embodiment of the present invention comprises of a method of reducing charge gain at the floating gate of a multi-level flash memory cell by applying a positive stress to a word line of the multi-level flash memory cell, the multi-level flash memory cell having a floating gate susceptible to charge gain resulting in a reduced read margin characteristic, the positive stress having a duration and an amplitude sufficient to reduce the charge gain and improve the read margin.

BRIEF DESCRIPTION OF THE DRAWINGS

The accompanying drawings, which are incorporated in and form a part of this specification, illustrate embodiments of the present invention, and together with the description, serve to explain the principles of the invention. Unless noted, the drawings referred to this description should be understood as not being drawn to scale.

DETAILED DESCRIPTION OF THE INVENTION

A new method for improving the accuracy of read-write operations in a multi-level flash memory cell is enclosed, reducing the read margin disturbance caused by normal operation of the cell, by applying a positive stress to the word line after an program-erase cycle.

In one embodiment, a method for de-trapping trapped charges in a non-volatile multi-level memory device is disclosed. The method comprises applying a de-trapping pulse to a control gate of a non-volatile multi-level memory device so as to de-trap positive charges (holes) trapped at the tunneling oxide or tunneling oxide-silicon interface underneath of the floating gate of the device.

Figure 4:
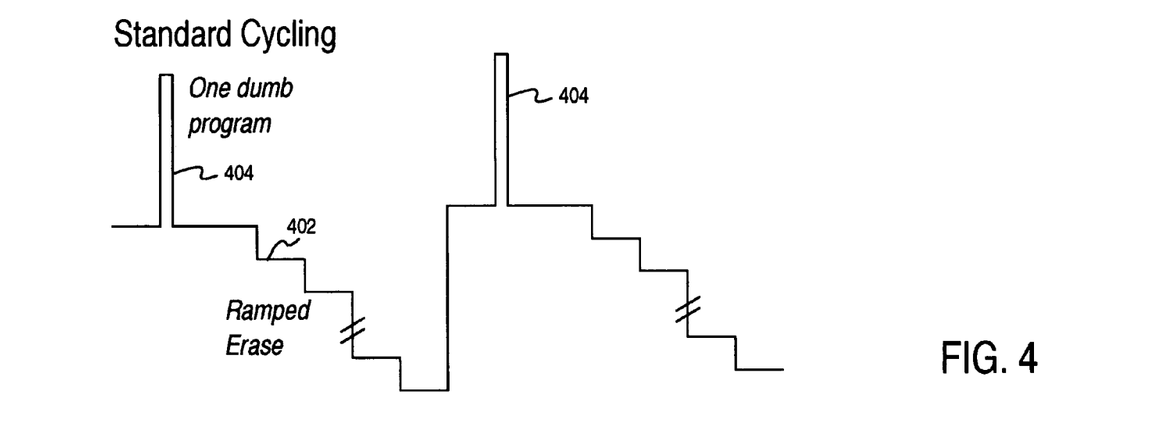
FIG. 4 shows a standard program/erase cycle that may be applied to a flash memory device.

FIG. 4 shows a standard program/erase cycle that may be applied to a flash memory device. As shown in this example of a "standard cycling," a ramped erase 402 follows the program pulse 404. In testing the operation of a flash memory device, the simple program/erase cycle is repeated for a given period of time, simulating the operation of the flash memory device in a circuit. After a given period of time of applying the program/erase pulse to the flash memory device, the effects of the cycling on operating characteristics of the flash memory device are measured.

As previously described, continuous application of the flash memory cell to stress caused by multiple program or erase cycles results in the gradual accumulation of trapped charges at the tunneling oxide or tunneling oxide-silicon interface underneath of the floating gate of the flash memory cell 18 (see FIG. 1). The accumulation of positive trapped charges or holes at the tunneling oxide or tunneling oxide-silicon interface underneath of the floating gate results in lower threshold voltage that the case without trapped charges. If these trapped charges (or holes) are de-trapped later, the threshold voltage increases. In the operation of a bi-level flash memory cell, the voltage gap between erased level (low threshold voltage state or logical 1) and programmed level (high threshold voltage state or logic state 0) is in most cases in order of at least 2 to 3 volts. The threshold voltage increase due to de-trapping holes may be in the order of as few as 100 milli-volts (mV). Therefore, the effect of the trapped holes and their de-trapping later does not interfere with the normal operation of the bi-level flash memory device.

In contrast, in the operation of a multi-level flash memory device such as the one disclosed in FIGS. 2 and 3, the threshold voltage gap between adjacent states such as level 1 (L1) corresponding to a logic value 11, level 2 (L2) corresponding to a logic value 01, level 3 (L3) corresponding to a logic value 10, and level 4 (L4) corresponding to logic value 00 are in order of a few hundred milli-volts. Thus, after a period of operation, the positive shift in the threshold voltage level corresponding to any of the four logic states may be large enough to cause faulty operation of the device. Furthermore, the popularity in the use of lower power devices may further exacerbate this problem, because the voltage gap between the threshold voltages corresponding to each logic state may be even smaller. Thus, any shift in the voltage level may be more detrimental to the proper operation of the multi-level flash memory device.

Figure 5:
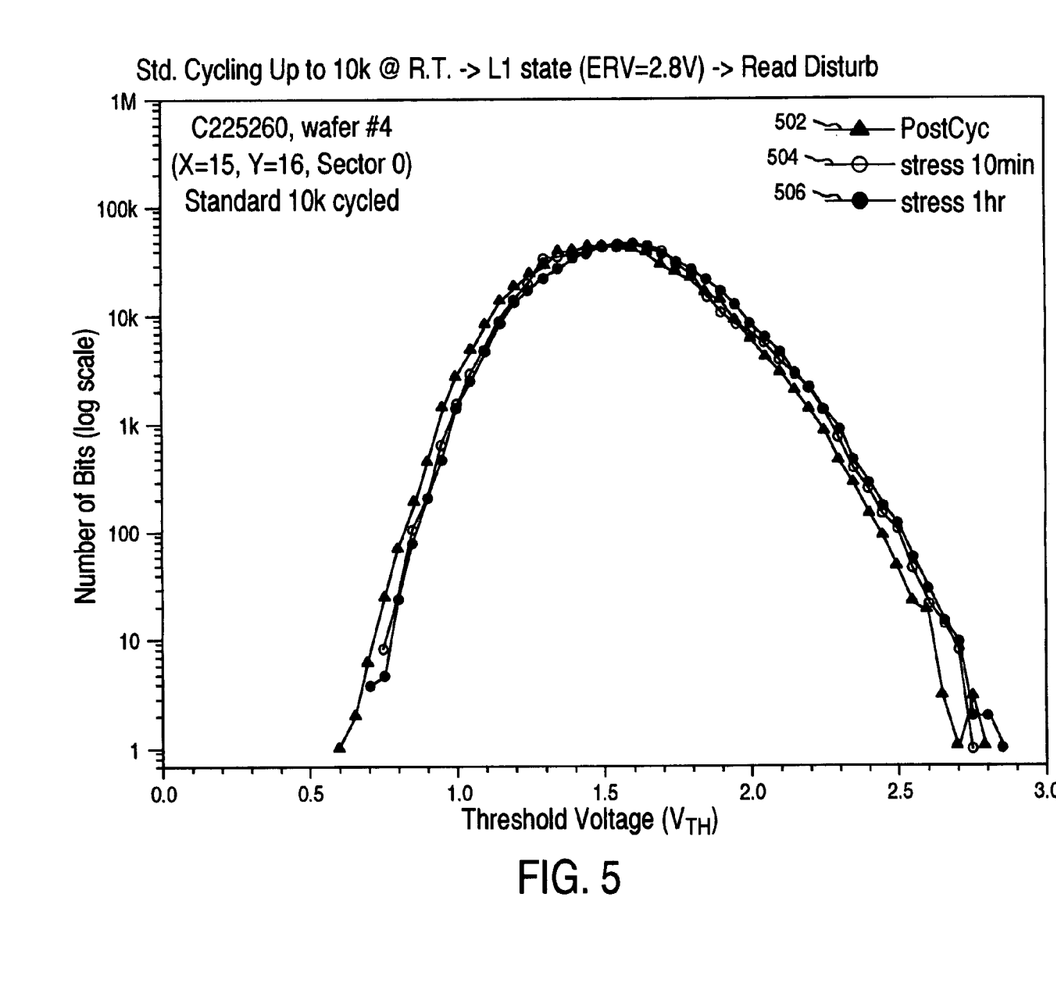
FIG. 5 illustrates the effects of stored charges at the floating gate of a flash memory device after 10 minutes and one-hour applications of read disturb stress.

FIG. 5 illustrates the effects of stored charges at the floating gate of a flash memory device after 10 minutes and one-hour applications of a standard programming and erase cycle simulating the read disturb stress. As shown in FIG. 5, the three plotted curves 502, 504 and 506 were experimentally obtained by the application of a standard write-erase cycling up to 10,000 times at room temperature, followed by read disturb stress up to one hour. Plotted curve 502 is the erased state (L1) threshold voltage distribution of memory cell array after 10,000 standard write-erase cycles. Plotted curves 504 and 506 are the effect of read stress for 10 minutes and one hour respectively. The plotted curves 504 and 506 show a positive shift of the threshold voltage of level 1 (L1) due to the accumulation of trapped holes at the tunneling oxide or tunneling oxide-silicon interface underneath the floating gate 18. As further shown by FIG. 5, most of the initial read distribution shift occurs within the first ten minutes of the stress signal.

Figure 6:
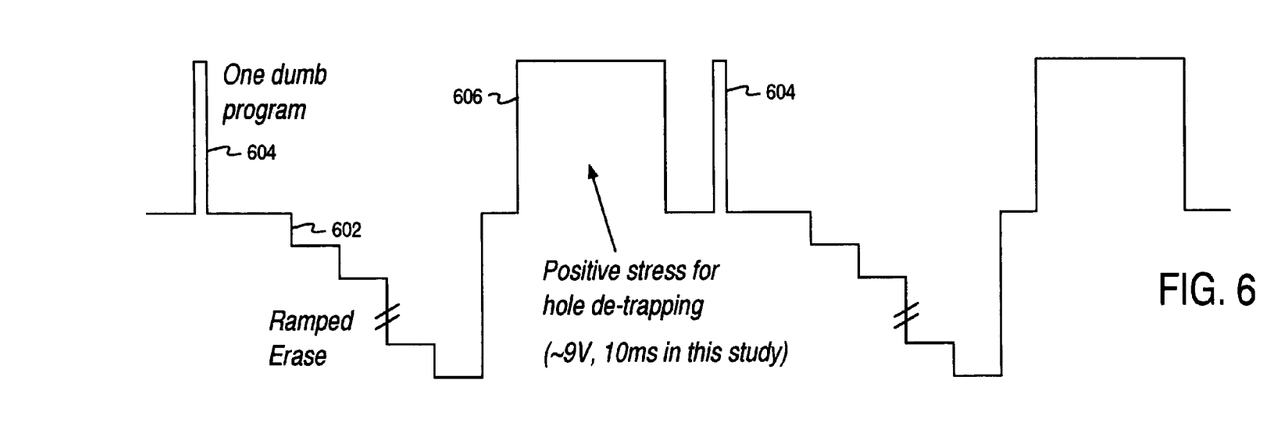
FIG. 6 shows a program/erase cycle according to one embodiment of the present invention.

FIG. 6 shows a program/erase cycle according to one embodiment of the present invention. As shown in FIG. 6, in one embodiment of the present invention, a positive stress signal 606 is applied to the flash memory cell 10 (of FIG. 1) after the previous erase signal 602 (same as the erase signal 402 of FIG. 4) and before the next write signal 604 (same as 404 in FIG. 4). The positive stress signal 606 is applied to the control gate 16 (of FIG. 1) while the substrate 20 is kept at a lower voltage relative to the control gate 16 (of FIG. 1). In one embodiment of the present invention, each positive stress pulse 606 applied to the flash memory device 10 has a duration of 10 milli-seconds (ms), and an amplitude of approximately 9 volts. The positive stress pulse, also referred to as the de-trapping pulse, creates an electric field between the control gate 16 and the substrate 20 such that the positively charged holes trapped at the tunneling oxide or tunneling oxide-silicon interface underneath of the floating gate 18 are repelled away from the tunnel oxide and toward the substrate 20. The duration of the de-trapping pulse should be long enough and the amplitude of the pulse should be high enough to create an electric field between the control gate 16 and the substrate 20 powerful enough for adequate length of time to allow a large percentage of the holes trapped at the tunneling oxide or tunneling oxide-silicon interface underneath of the floating gate 18 to disperse to the substrate 20.

It should be noted, that in an alternative embodiment, the de-trapping pulse 606 may be applied to the flash memory device in a sequence other than after the erase pulse 602 and before the write pulse 604.

Figure 7:
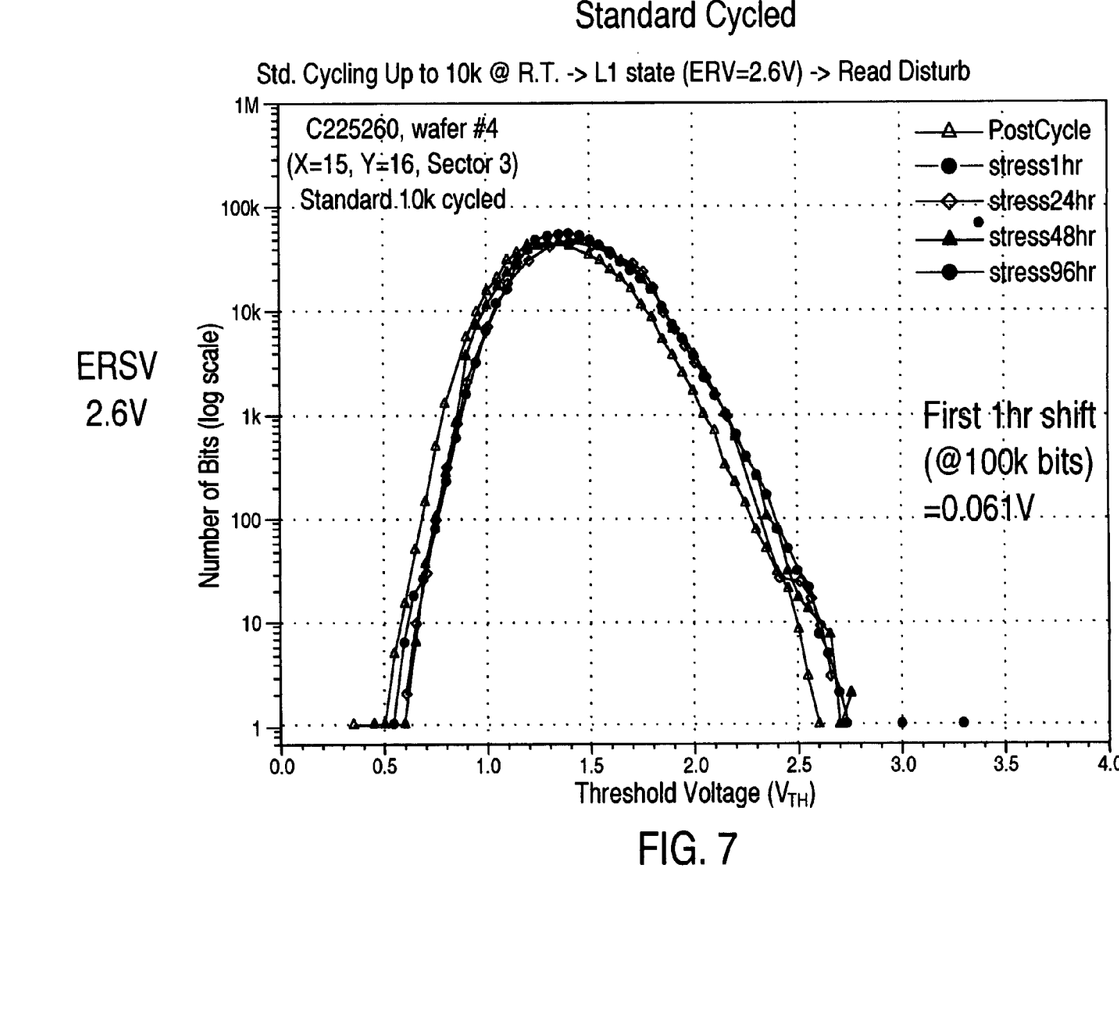
FIG. 7 shows a graphical representation of the effect of the erase depth on the L1 threshold voltage level shift under a standard write-erase cycle and a write-erase cycle according to one embodiment of the present invention write-erase cycle.

FIG. 7 shows a graphical representation of the effect of the erase depth on the L1 threshold voltage level shift after a standard write-erase cycle and a write-erase cycle according to one embodiment of the present invention write-erase cycle (known as high temperature retention bake (HTRB)-Embedded ERS Cycling in the art, but room temperature stress may also be used). As shown in FIG. 7, after the application of 10,000 cycles and subsequent erasing the memory array below the erase verify level (ERSV) of 2.6V, the memory array receives read disturb stress by applying positive voltage to the control gate. In general, the memory array that received the standard write-erase will have a threshold voltage distribution shift of 61 mV after one hour of stress. In contrast, the HTRB-Embedded ERS cycling only shifts the threshold voltage distribution 43 mV after one hour of stress, indicating that the present invention can reduce the threshold voltage shift under read disturb stress. The same results have been observed with different erase depth (or different erase verify level, ERSV). For example, with ERSV of 2.8 V, the shift of L1 threshold voltage after standard cycling is 79 mV in contrast to a shift of 44 mV after HTRB-Embedded ERS cycling.

The experimental results also show that the read disturb (or HTRB) has two phases: an initial shift (occurring in less than one hour) and a tail-bits phase (typically longer than 12 hours). Most of the initial distribution shift happens within the first ten minutes after the application of the read disturb stress. Experimental results have confirmed that even though the application of a positive stress for hole de-trapping reduces initial read-disturb shifts (threshold voltage shift) for all levels L1, L2 and L3, the same tail-bit behavior for both standard cycling and HTRB-embedded erase cycling occurs. Additionally, no major differences in initial shifts due to different erase depths are measured. However, the deeper erase depths result in earlier and larger tail-bits.

The table below summarizes the charge gain and its corresponding shift effect for L1, L2 and L3 after a one hour application of a read disturb stress to a multi-level flash memory device, measured at the 100 bits level. The charge gain induced shift effect for L1 is measured at erase depths ERSV 2.6 volts and 2.8 volts.

|  | L1 Charge Gain with an erase depth of 2.6 volts | L1 Charge Gain with an erase depth of 2.8 volts | L2 Charge gain | L3 Charge Gain |
| --- | --- | --- | --- | --- |
| After standard 10 K Cycling | 61 mV | 79 mV | 84 mV | 61 mV |
| After HTRB-Embedded ERS 10 K Cycling | 43 mV | 44 mV | 28 mV | 23 mV |

Figure 8:
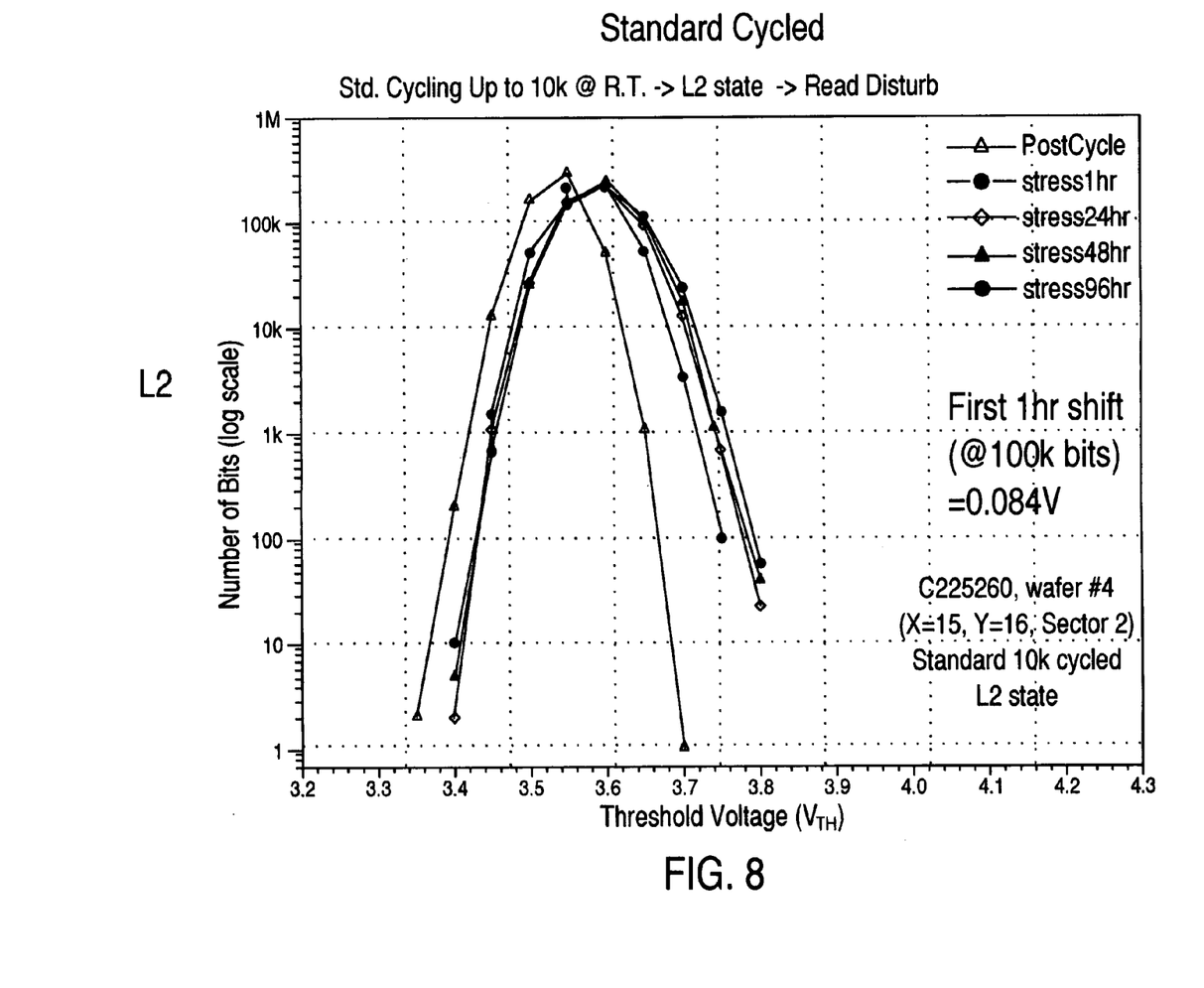
FIG. 8 shows a graphical comparison of the performance of level 2 (L2) and level 3 (L3) threshold voltages after the application of a standard write-erase cycle versus a write-erase cycle according to one embodiment of the present invention.

Experimental results shown in FIG. 8 show only a 10 mV difference in initial shift for a 0.5 volts erase depth difference. The shift at the 3.0 volts ERSV was 89 mV after one hour of read disturb application, versus a 102 mV shift for the 2.5 volts ERSV. Additionally, after 48 and 96 hours, the tailbits are greater in numbers and show up earlier for ERSV of 2.5V than for 3.0V ERSV.

FIG. 8 shows a graphical comparison of the performance of level 2 (L2) and level 3 (L3) threshold voltages after the application of a standard write-erase cycle versus a write-erase cycle according to an embodiment of the present invention. As shown in FIG. 8, the new ERS cycling results in significantly smaller threshold voltage shifts for both L2 and L3 threshold voltage levels. For L2 threshold level, the shift at 100 Kbits, after a one-hour of application of the new ERS write-erase cycling is only 0.028 volts versus a 0.084 volts shift caused by the standard cycling. Similarly, the L3 threshold level, the shift at 100 Kbits, after one hour of applying the new ERS write-erase cycling is only 0.023 volts versus a 0.061 volts shift caused by the standard cycling.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method of de-trapping trapped charges in a non-volatile multi-level memory device having at least a control gate, and a floating gate, the method comprising:
    applying a de-trapping pulse to a control gate of a non-volatile multi-level memory device so as to de-trap positive charges trapped at a tunneling oxide or tunneling oxide-silicon interface underneath a floating gate of the device, whereby the application of the pulse reduces the read disturbance by minimizing a shift of a threshold voltage corresponding to each level of the multi-level memory device.

2. The method of claim 1 wherein the application of the pulse occurs after an erase pulse but before a programming pulse.

3. The method of claim 1 wherein the de-trapping pulse has a duration of about ten milliseconds.

4. The method of claim 1 wherein the de-trapping pulse has an amplitude of about 9 volts.

5. The method of claim 1 wherein the de-trapping pulse voltage is positive with respect to the substrate.

6. A computer program embodied on a computer readable medium for de-trapping trapped charges in a non-volatile multi-level memory device having at least a control gate, and a floating gate, the computer program comprising:

code for applying a de-trapping pulse to a control gate of a non-volatile multi-level memory device so as to de-trap positive charges trapped at a tunneling oxide or tunneling oxide-silicon interface underneath a floating gate of the device, whereby the application of the pulse reduces the read disturbance by minimizing a shift of a threshold voltage corresponding to each level of the multi-level memory device.

7. The computer program of claim 6 wherein the application of the pulse occurs after an erase pulse but before a programming pulse.

8. The computer program of claim 6 wherein the de-trapping pulse has a duration of about ten milliseconds.

9. The computer program of claim 6 wherein the de-trapping pulse has an amplitude of about 9 volts.

10. The computer program of claim 6 wherein the de-trapping pulse voltage is positive with respect to the substrate.

11. A system for de-trapping trapped charges in a non-volatile multi-level memory device having at least a control gate, and a floating gate, the system comprising:

means for applying a de-trapping pulse to a control gate of a non-volatile multi-level memory device so as to de-trap positive charges trapped at a tunneling oxide or tunneling oxide-silicon interface underneath a floating gate of the device, whereby the application of the pulse reduces the read disturbance by minimizing a shift of a threshold voltage corresponding to each level of the multi-level memory device.

* * * * *

UNITED STATES PATENT AND TRADEMARK OFFICE
CERTIFICATE OF CORRECTION

PATENT NO. : 7,142,455 B1 Page 1 of 1
APPLICATION NO. : 10/839562
DATED : November 26, 2006
INVENTOR(S) : Sung-Chul Lee, Sheung-Hee Park and Richard M. Fastow It is certified that error appears in the above-identified patent and that said Letters Patent is hereby corrected as shown below:

Title Page, Item (73)
Correct Assignee name as follows:

(73) Assignee: Spansion LLC

Signed and Sealed this

Thirteenth Day of February, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,142,455 B1 |
| APPLICATION NO. | : 10/839562 |
| DATED | : November 28, 2006 |
| INVENTOR(S) | : Sung-Chul Lee, Sheung-Hee Park and Richard M. Fastow |

It is certified that error appears in the above-identified patent and that said Letters Patent is hereby corrected as shown below:

Title Page, Item (73)
Correct Assignee name as follows:

(73) Assignee:    Spansion LLC

This certificate supersedes Certificate of Correction issued February 13, 2007.

Signed and Sealed this

Sixth Day of March, 2007

JON W. DUDAS
*Director of the United States Patent and Trademark Office*